(12) United States Patent
Komori (10) Patent No.: US 6,555,885 B2
(45) Date of Patent: Apr. 29, 2003

(54) SEMICONDUCTOR DEVICE AND METHOD OF MANUFACTURING THE SAME

(75) Inventor: Shigeki Komori, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/908,608

(22) Filed: Jul. 20, 2001

(65) Prior Publication Data

US 2002/0090757 A1 Jul. 11, 2002

(30) Foreign Application Priority Data

Jan. 11, 2001 (JP) .................................... 2001-003564

(51) Int. Cl.[7] .............................................. H01L 29/76
(52) U.S. Cl. ...................... 257/410; 257/384; 257/915
(58) Field of Search ................................ 438/653, 304, 438/595, 576, 582, 627, 656, 628, 643, 648, 142; 257/412, 382, 385, 381, 377

(56) References Cited

U.S. PATENT DOCUMENTS

| 4,183,040 A | * | 1/1980 | Rideout ..................... 257/300 |
| 5,027,185 A | * | 6/1991 | Liauh ........................ 257/384 |
| 5,733,816 A | * | 3/1998 | Iyer et al. .................. 438/592 |
| 5,894,160 A | * | 4/1999 | Chan et al. ................. 257/377 |
| 6,022,799 A | * | 2/2000 | Foote et al. ................. 438/637 |
| 6,025,265 A | * | 2/2000 | Miller et al. ................ 438/592 |
| 6,080,629 A | * | 6/2000 | Gardner et al. ............. 438/301 |
| 6,096,641 A | * | 8/2000 | Kunikiyo .................... 438/304 |
| RE36,938 E | * | 10/2000 | Chan et al. ................. 438/612 |
| 6,156,630 A | * | 12/2000 | Iyer .......................... 438/585 |
| 6,187,674 B1 | * | 2/2001 | Chen et al. ................. 438/653 |
| 6,204,198 B1 | * | 3/2001 | Banerjee et al. ............ 438/766 |
| 6,222,240 B1 | * | 4/2001 | Gardner et al. ............. 257/410 |
| 6,281,052 B1 | * | 8/2001 | Shinmura .................... 438/142 |
| 6,352,872 B1 | * | 3/2002 | Kim et al. .................... 438/24 |
| 6,380,055 B2 | * | 4/2002 | Gardner et al. ............. 438/585 |
| 2002/0090757 A1 | * | 7/2002 | Komori ....................... 464/120 |

FOREIGN PATENT DOCUMENTS

| JP | 2-265248 | 10/1990 | |
| JP | 9-246551 | 9/1997 | |
| JP | 11087701 A | * 3/1999 | ........... H01L/29/78 |

* cited by examiner

Primary Examiner—Carl Whitehead, Jr.
Assistant Examiner—Laura M Schillinger
(74) Attorney, Agent, or Firm—McDermott, Will & Emery

(57) ABSTRACT

A semiconductor device having a gate electrode structure including at least a metal film and a polysilicon film is disclosed. The polysilicon film of the semiconductor is doped with impurities several times so that an upper portion of the polysilicon film becomes higher in doping level than a lower portion of the same.

5 Claims, 11 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device, and more particularly to a semiconductor device having a CMOS dual-gate electrode structure; that is, a polymetal gate electrode structure which prevents interface resistance from arising between polysilicon and a metal film while suppressing interdiffusion and depletion of polysilicon of the gate electrode, as well as to a method of manufacturing the semiconductor device.

2. Background Art

In general, a CMOS structure has widely been used in the field of semiconductor devices, because of its low power dissipation characteristic.

Figure 13:
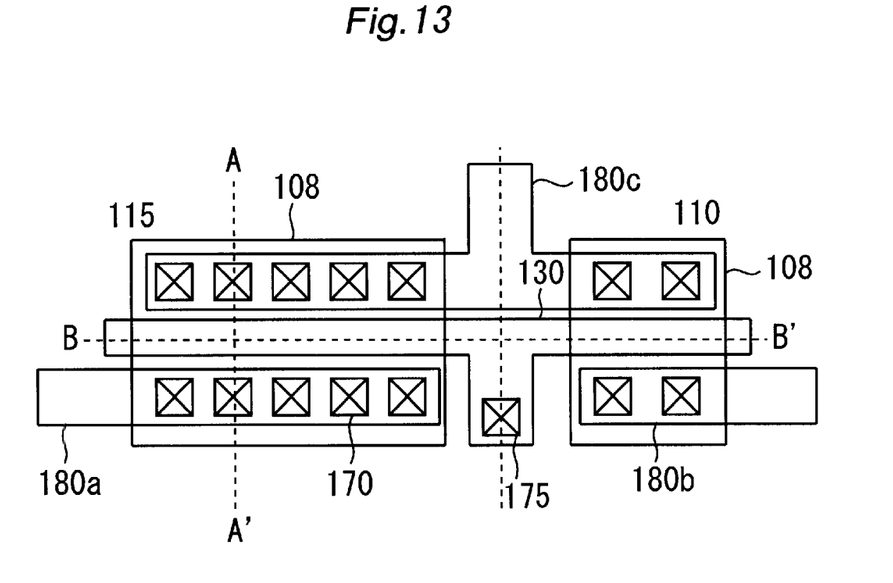
FIG. 13 is a top view showing a related-art semiconductor device.
Figure 14:
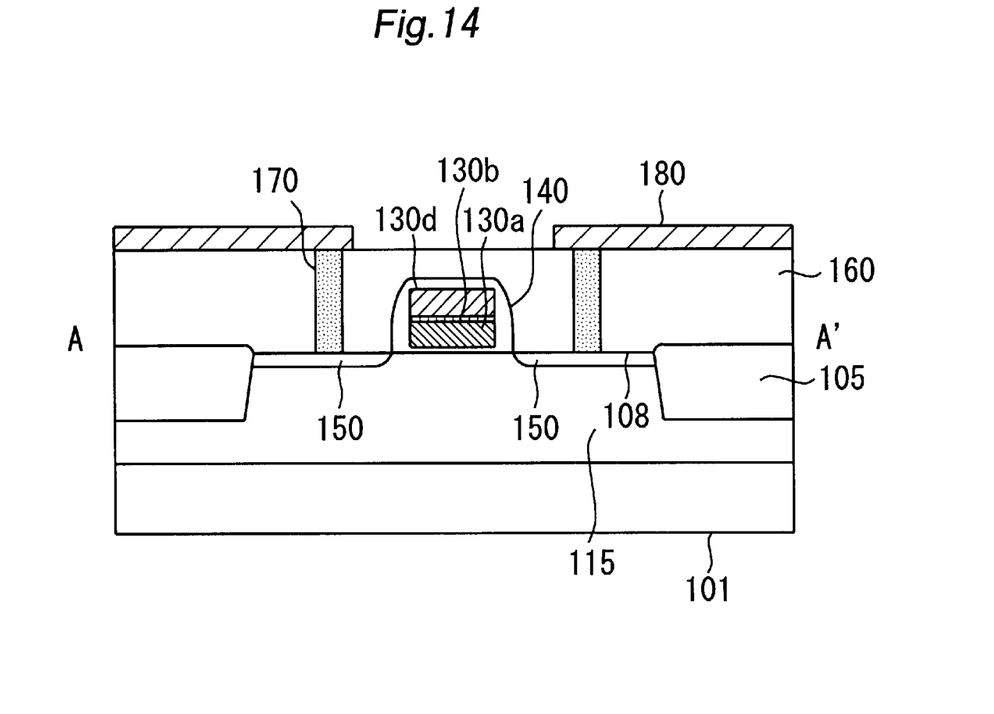
FIG. 14 is a cross-sectional view of the inverter taken along line A–A' in FIG. 13.
Figure 16:
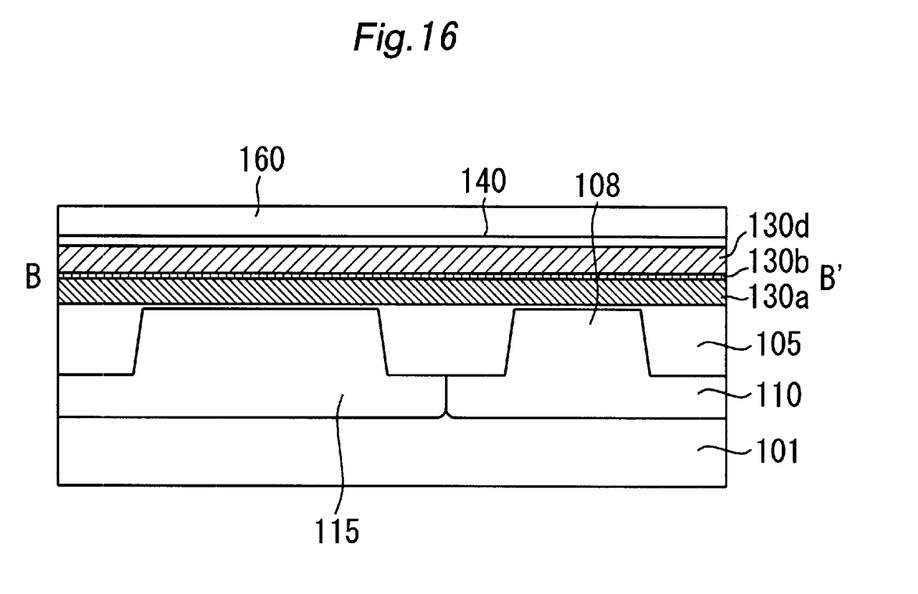
FIG. 16 is a cross-sectional view of the inverter taken along line B–B' in FIG. 13.

FIG. 13 is a top view showing a related-art semiconductor device. The drawing shows an inverter, which is the basic circuit of CMOS structure, wherein an n-channel transistor and a p-channel transistor are fabricated on a single chip. FIG. 14 is a cross-sectional view of the inverter taken along line A–A', and FIG. 16 is a cross-sectional view of the inverter taken along line B–B'.

In these drawings, reference numeral 101 designates a silicon substrate; 105 designates an isolation region; 108 designates an active region; 110 designates a P-well; 115 designates an N-well; 130 designates a gate electrode; 130a designates a polysilicon film; 130b designates a barrier layer; 130d designates a metal film; 140 designates an insulating film formed on top and side of a gate electrode; 150 designates a P$^+$-source/drain electrode; 160 designates an interlayer insulating film; 170 and 175 designate contact holes; and 180 and 180a through 180c designate interconnection.

In order to achieve higher packaging density, the gate electrode 130 is shared between the n-channel transistor and the p-channel transistor. If the gate electrode 130 shared between the n-channel transistor and the p-channel transistor is separated, separated gate electrodes must be interconnected together on an interconnection layer by way of contact holes, thus involving provision of additional space for the contact holes.

Shortening of a channel of a gate electrode has recently been pursued for achieving a higher packaging density. The dominating p-channel transistors are of related-art embedded channel type and cannot sustain a short-channel effect. As in the case of an n-channel transistor, the p-channel transistor must be changed to a surface channel type, and the conductivity type of gate electrodes must be changed as well.

As shown in FIG. 14, before a non-doped polysilicon gate electrode deposited on a gate oxide film is subjected to etching, an n-channel region is doped with n$^+$ ions. Further, a p-channel region is doped with p$^+$ ions. As a result, an n$^+$-type region and a p$^+$-type region coexist in a single gate electrode. A reduction in the length of a channel of the gate electrode; that is, a reduction in the thickness of the gate electrode, involves a rise in the resistance of the polysilicon gate electrode. In order to reduce the resistance of the polysilicon gate electrode, a metal film 130d must be deposited on the polysilicon film 130a.

A structure in which the metal film 130d is laid over the polysilicon film 130a encounters the following problems, and hence a layer called a barrier layer 130b is interposed between the metal film 130d and the polysilicon film 130a. One problem is that a reaction between the metal film 130d and the polysilicon film 130a; that is, a silicide reaction, arises, thereby inducing occurrence of holes in the polysilicon film 130a. Another problem is that impurities doped in the polysilicon film 130a diffuse into metal or into a compound of metal with polysilicon, thereby reducing a net density of impurities doped in one of adjacent transistors of opposite conductivity types.

Figure 15:
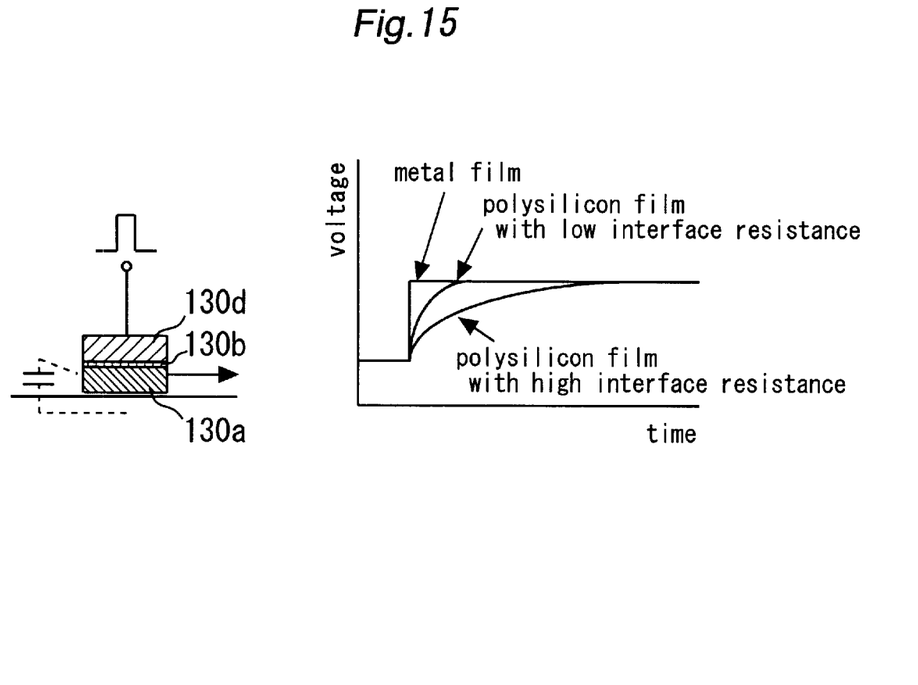
FIG. 15. is a graph showing a problem of a related-art semiconductor device.

Forming the barrier layer 130b solves these problems. However, the barrier layer 130b is usually a metal nitride film and deficient in conductivity. A contact hole to be connected to a gate electrode extends to the metal film 130d from above. In fact, a channel is not established unless an electric field is applied to the lower polysilicon film 130a. In this way, if the barrier layer 130b is sandwiched between the polysilicon film 130a and the metal film 130d, high interface resistance arises between the metal film 130d and the polysilicon film 130a. As a result, a delay arises in transfer of a voltage, as shown in FIG. 15. Such a delay is one cause of a delay time in a logic gate typified by an inverter or a NAND.

As mentioned above, a polymetal gate electrode of a related-art semiconductor device is constructed of a three-layer structure consisting of a metal film, a nitrided metal film, and a polysilicon film, where a barrier layer induces a rise in interface resistance between the nitrided metal film and the polysilicon film, thereby reducing the speed of the overall LSI.

SUMMARY OF THE INVENTION

The purpose of the present invention is to provide a semiconductor device having a new gate electrode structure and a method of manufacturing the semiconductor device. The gate electrode structure according to the present invention reduces interface resistance between a barrier layer and a polysilicon film and to prevent occurrence of a delay in transfer of a voltage in the polymetal gate electrode.

According to one aspect of the present invention, a semiconductor device comprises a gate electrode structure including at least a metal film and a polysilicon film, wherein the polysilicon film is doped with impurities several times. As a result an upper portion of the polysilicon film becomes higher in doping level than a lower portion of the same.

In other aspect of the present invention, a method of manufacturing a semiconductor device comprises the steps of forming a polysilicon film on a semiconductor substrate; forming a barrier layer from a plurality of layers on the polysilicon film; and forming a metal film on the barrier layer.

In other aspect of the present invention, a method of forming a semiconductor device comprises the steps of forming a polysilicon film on a semiconductor substrate; doping the polysilicon film with impurities a plurality of times; and forming a metal film on the impurity-doped polysilicon film.

Other and further objects, features and advantages of the invention will appear more fully from the following description.

BRIEF DESCRIPTION OF THE DRAWINGS

FIGS. 7A through 8C are cross-sectional views showing a semiconductor device according to a fifth embodiment.

FIGS. 9A through 10C are cross-sectional views showing a semiconductor device according to a sixth embodiment.

DETAILED DESCRIPTION OF THE PREFERRED EMBODIMENTS

Figure 1:
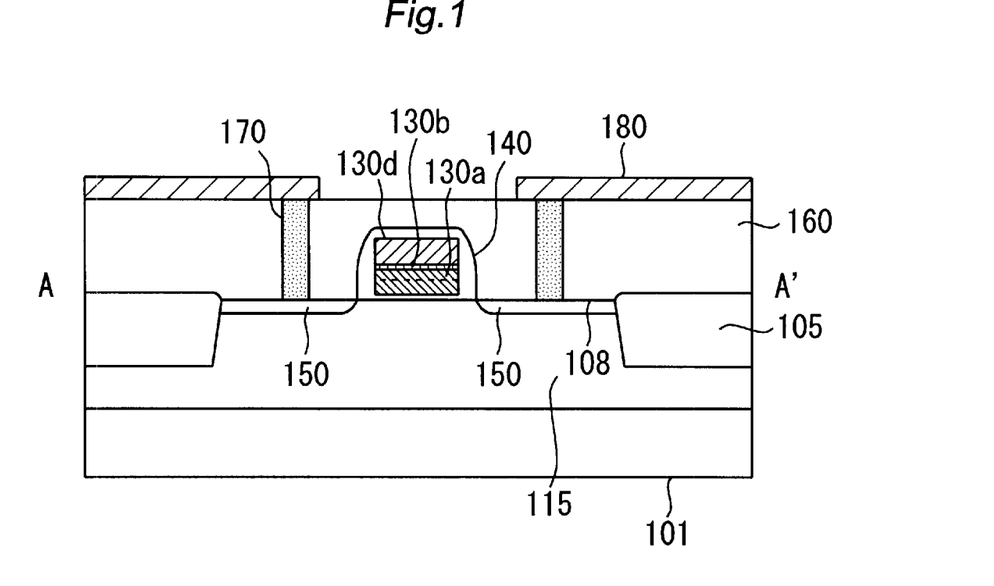
FIG. 1 is a cross-sectional view showing a semiconductor device according to a first embodiment of the present invention.

Preferred embodiments of the present invention will now be described by reference to the accompanying drawings.
First Embodiment FIG. 1 is a cross-sectional view showing a semiconductor device according to a first embodiment of the present invention. In FIG. 1, elements, which are identical with those shown in FIG. 14, are assigned the same reference numerals.

In the drawing, reference numeral 101 designates a silicon substrate; 105 designates an isolation region; 108 designates an active region; 115 designates an n-type well; 130a designates a polysilicon film; 130b designates a barrier layer; 130d designates a metal film; 140 designates an insulating film formed on top and side of a gate electrode; 150 designates a P$^+$-source/drain electrode; 160 designates an interlayer insulating film; 170 designates a contact hole; and 180 designates an interconnection.

High-melting-point metal, such as tungsten, is used as the metal film 130d, and a metal nitride film; e.g., a tungsten nitride film is used as the barrier layer 130b.

Figure 2:
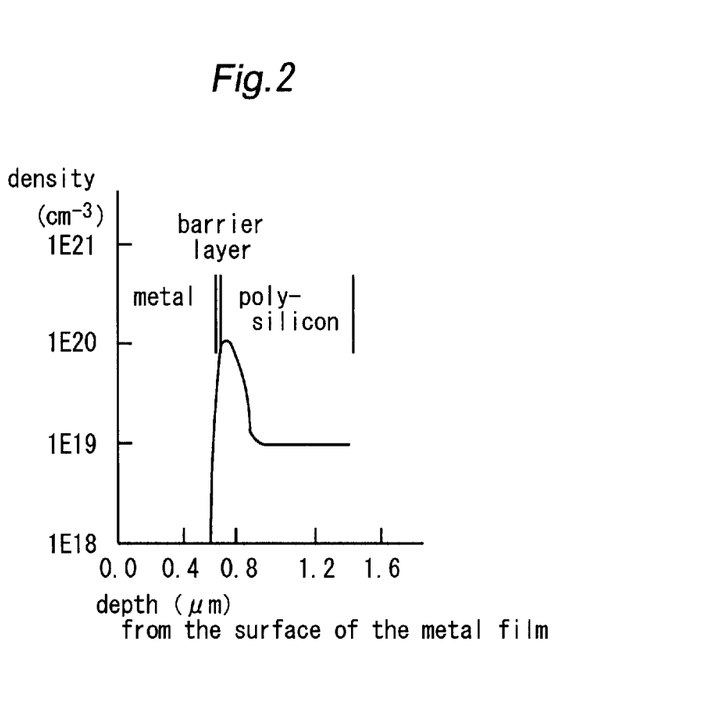
FIG. 2. is a graph showing a profile of impurities doped in a gate electrode in the first embodiment.

In the first embodiment, a profile of impurities doped in a gate electrode is set as shown in FIG. 2. More specifically, the first embodiment is characterized in that an upper portion of the polysilicon film 130a close to the barrier layer 130b is higher in doping level than a lower portion of the polysilicon film 130a close to a gate oxide film. As a result, contact resistance of an interface between the barrier layer 130b formed from a metal nitride film and the polysilicon film 130a; that is, interface resistance, is reduced. The same advantageous result is yielded even when another type of metal, such as nickel, cobalt, titanium, or ruthenium, maybe used as metal of the barrier layer 130b in place of tungsten.

Figure 3:
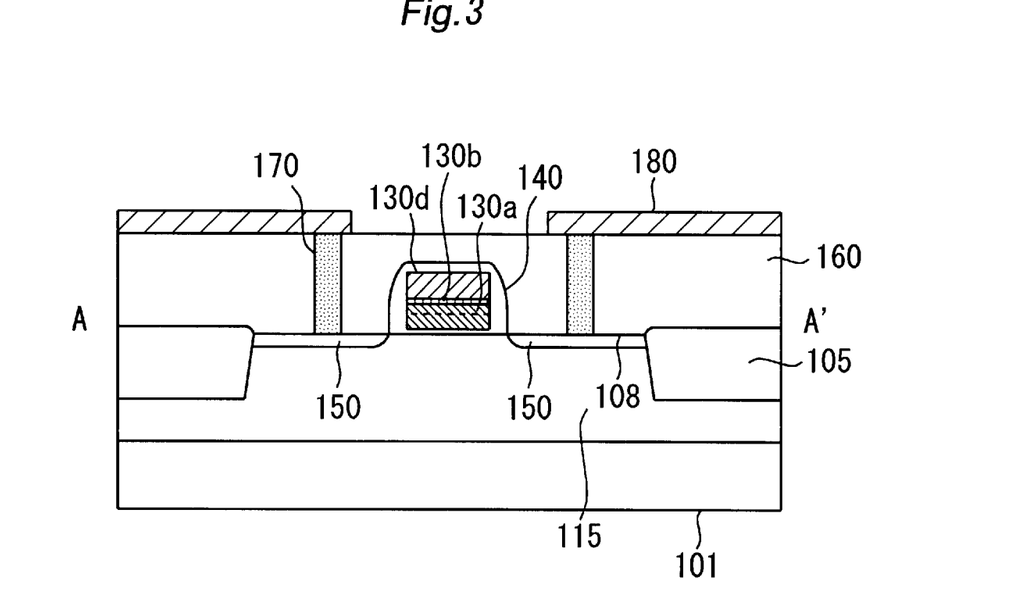
FIG. 3. is a cross-sectional view of a semiconductor device according to a second embodiment.

In the present embodiment, in connection with a gate electrode structure comprising a metal film, a barrier layer, and a polysilicon film, the upper portion of the polysilicon film is made higher in doping level than the lower portion of the same. As a result, contact resistance of an interface between the barrier layer and the polysilicon film; that is, interface resistance, can be reduced. Accordingly, a delay in transfer of a voltage in the polymetal gate electrode can be prevented.
Second Embodiment FIG. 3 is a cross-sectional view of a semiconductor device according to a second embodiment of the present invention. In FIG. 3, elements, which are identical with those shown in FIG. 1, are assigned the same reference numerals, and their detailed explanations are omitted.

As shown in the drawing, reference numeral 130b designates a barrier layer, and a metal nitride film is used as the barrier layer 130b. By way of example, a tungsten nitride film is used as the barrier layer 130b.

Figure 4:
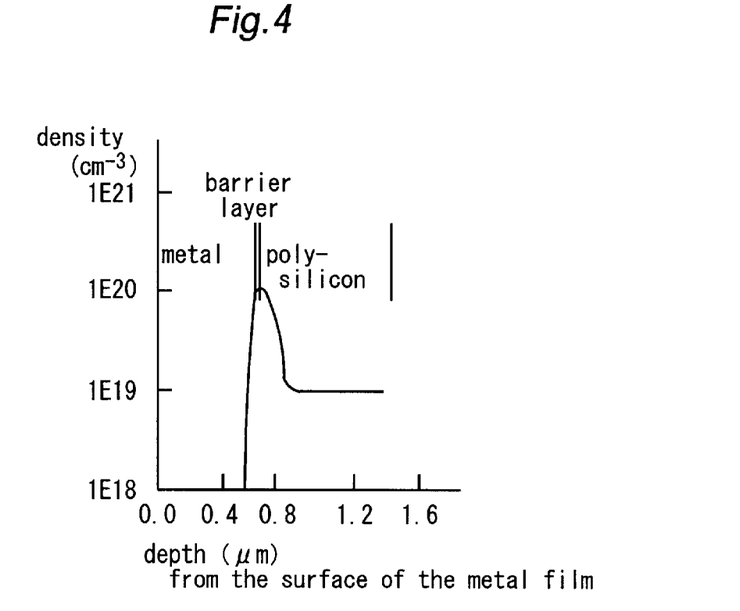
FIG. 4. is a graph showing a profile of impurities doped in a gate electrode in the second embodiment.

The doping level of the barrier layer 130b in the second embodiment is substantially different from that in the first embodiment. The barrier layer 130b in the second embodiment is doped with impurities as shown in FIG. 4., though the barrier layer 130b in the first embodiment is not doped with impurities. As a result, the doping level of the polysilicon film is prevented from declining, which would otherwise be caused in subsequent processes. Thus, there is yielded an advantage of ability to provide a gate electrode structure that can withstand heat treatment.

Figure 5:
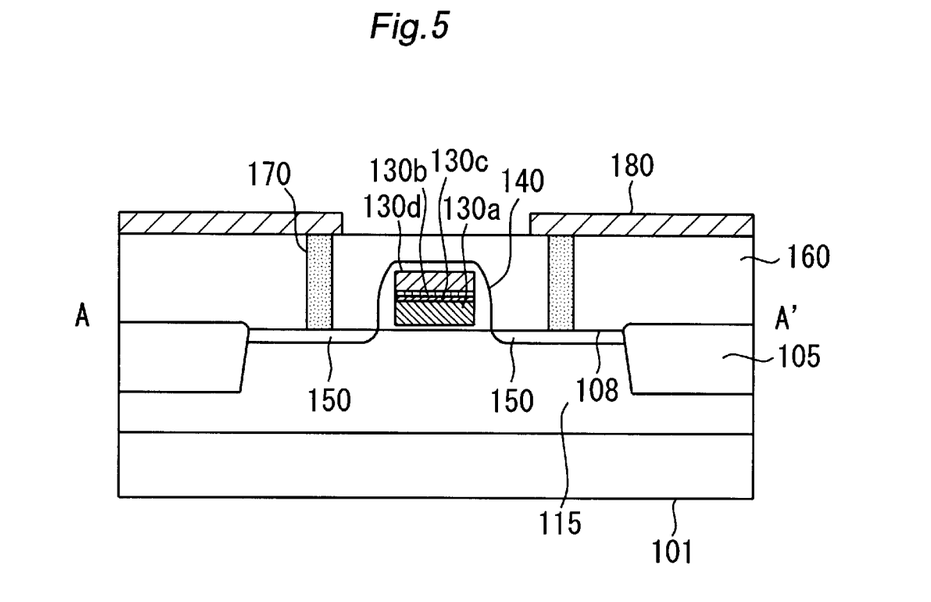
FIG. 5 is a cross-sectional view of a semiconductor device according to a third embodiment.

In the present embodiment, in connection with a gate electrode structure comprising a metal film, a barrier layer, and a polysilicon film, the upper portion of the polysilicon film is made higher in doping level than the lower portion of the same, and the barrier layer is also doped with impurities. As a result, contact resistance of an interface between the barrier layer and the polysilicon film; that is, interface resistance, can be reduced. Accordingly, a delay in transfer of a voltage in the polymetal gate electrode can be prevented. Further, a gate electrode structure that can withstand heat treatment is provided.
Third Embodiment FIG. 5 is a cross-sectional view of a semiconductor device according to a third embodiment of the present invention. In FIG. 5, elements, which are identical with those shown in FIG. 1, are assigned the same reference numerals, and their detailed explanations are omitted.

In the drawings, reference numeral 130c designates another barrier layer formed below the barrier layer 130b. The lower barrier layer 130c is formed from a metal silicide film, and the upper barrier layer 130b is formed from a metal nitride film.

Here, the barrier layer is formed into a two-layer structure consisting of, e.g., a tungsten nitride film and a tungsten silicide film. The tungsten nitride film constituting the upper barrier layer 130b is present for inhibiting a chemical reaction between the polysilicon film 130a and the metal film 130d as described in connection with the first embodiment. The lower barrier layer 130c is a diffusion prevention film for preventing diffusion of the metal nitride film constituting the upper barrier layer 130b into the polysilicon film 130a.

In the present embodiment, in connection with a gate electrode structure comprising a metal film, a barrier layer, and a polysilicon film, the barrier layer is formed into a two-layer structure consisting of an upper metal nitride film and a lower metal silicide film, thereby preventing diffusion of the upper metal nitride film into the polysilicon film. As a result, there can be prevented occurrence of interdiffusion, which would otherwise arise in a so-called dual-gate electrode having a single gate electrode shared between an n-channel transistor and a p-channel transistor.

Fourth Embodiment

Figure 6:
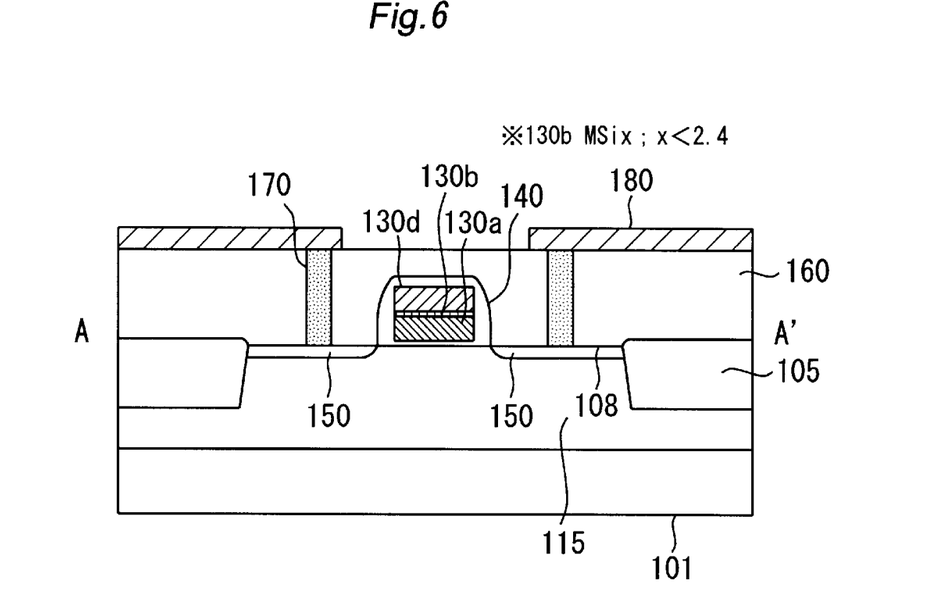
FIG. 6 is a cross-sectional view of a semiconductor device according to a fourth embodiment.

FIG. 6 is a cross-sectional view of a semiconductor device according to a fourth embodiment of the present invention. In FIG. 6, elements, which are identical with those shown in FIGS. 1 and 5, are assigned the same reference numerals, and their detailed explanations are omitted.

The fourth embodiment relates to one of the barrier layers; that is, the lower barrier layer 130c consisting of the metal silicide film. In the present embodiment, a composition ratio of silicon to metal contained in the metal silicide film is set a value of 2.4 or less.

If the composition ratio of silicon to metal included in the metal silicide film; that is, the barrier layer 130c, is set so as to exceed a value of 2.4, impurities doped in the gate electrode are subjected to interdiffusion by way of the inside of the barrier layer 130c. However, as mentioned in connection with the present embodiment, if the composition ratio of silicon to metal included in the metal silicide film of the barrier layer 130c is set to a value of 2.4 or less, interdiffusion of impurities can be prevented. Further, in the present embodiment, a balance is achieved between silicon and metal of the metal silicide film of the barrier layer 130c. Hence, silicide reaction does not arise between the barrier layer 130c and the lower polysilicon film 130a. Hence, the semiconductor device according to the present embodiment is characterized in that holes are less likely to arise in the polysilicon film 130a when the semiconductor device is subjected to heat treatment in subsequent processes.

In the present embodiment, the composition ratio of silicon to metal included in a metal silicide film, which is one of barrier layers, is set to a value of 2.4 or less, whereby interdiffusion of impurities can be prevented. Hence, there can be prevented formation of holes in a polysilicon film, which would otherwise be induced by heat treatment to be performed in subsequent processes.

Fifth Embodiment

FIGS. 7A through 8C are cross-sectional views showing a semiconductor device according to a fifth embodiment of the present invention. The present embodiment substantially describes processes of manufacturing the semiconductor devices described in connection with the third and fourth embodiments. The present embodiment will now be described while elements corresponding to those shown in FIG. 16 are assigned the same reference numerals.

Figure 7A:
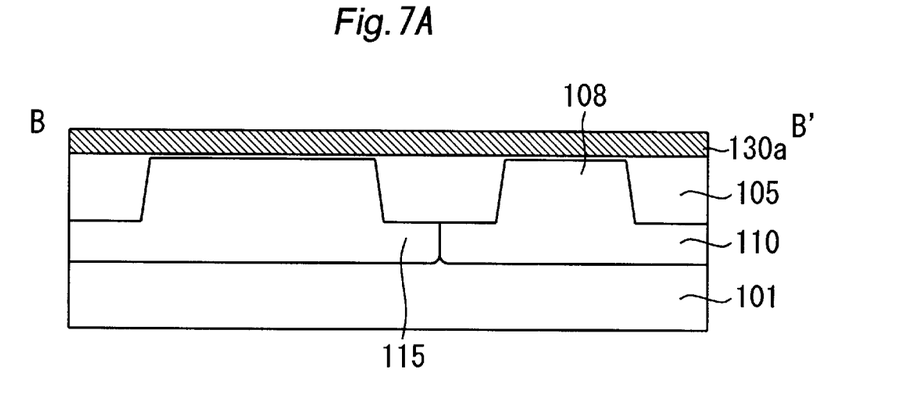

As shown in FIG. 7A, a gate oxide film and the polysilicon film 130a are formed after isolation and well processes have been completed. Here, a gate oxide film corresponds to an insulating film formed in a narrow gap between the isolation region 105 and the polysilicon film 130a shown in FIG. 7A.

In this phase, a plurality of gate oxide films may be present. Further, the polysilicon film 130a may be formed from amorphous silicon.

Figure 7B:
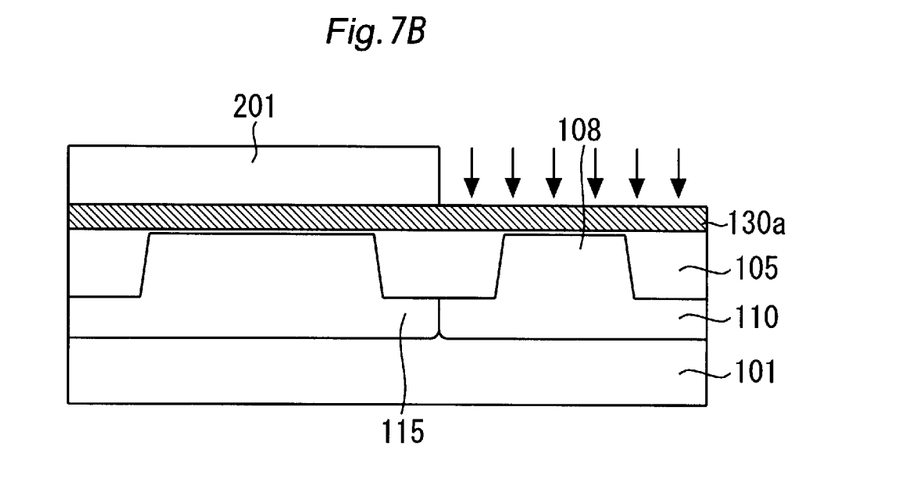

As shown in FIG. 7B, the gate electrode is doped with impurities. In other words, resist 201 is patterned such that only an n-channel transistor of a CMOS device becomes exposed. The polysilicon film 130a is doped with n-type impurities while covered with the resist 201. For example, provided that the polysilicon film 130a assumes a thickness of 80 nm, the polysilicon film 130a is doped with, e.g., arsenic, at 10 keV to a dopant concentration of $5 \times 10^{15}/cm^2$ or thereabouts.

Figure 7C:
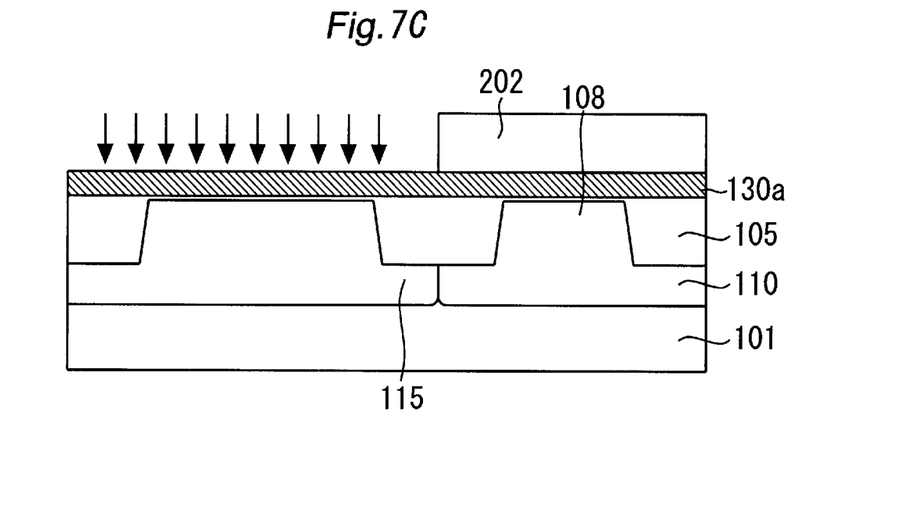

Contrary to the previously-described step, resist 202 is patterned such that only a p-channel transistor of the CMOS device becomes exposed, as shown in FIG. 7C. The polysilicon film 130a is doped with impurities which are opposite in polarity to those used in the previous process; that is, with p-type impurities, by means of ion implantation. In this case, the polysilicon film 130a is doped with, e.g., boron, at 5 keV to a dopant concentration of $5 \times 10^{15}/cm^2$ or thereabouts.

Figure 8A:
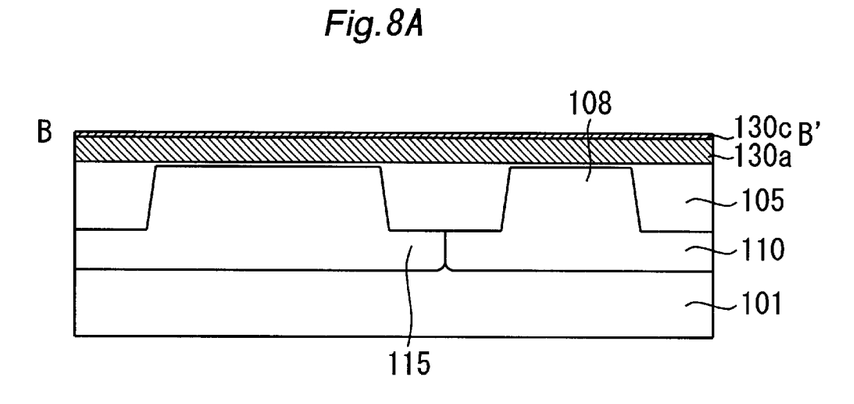

As shown in FIG. 8A, a tungsten silicide film is deposited on the polysilicon film 130a as the barrier layer 130c to a thickness of, e.g., 5 nm. A tungsten silicide film used in this case is one which is popularly used, and usually has a composition ratio of about 3 for reducing extraneous substances.

In the process shown in FIG. 8A, the silicon substrate 101 is subjected to heat treatment by means of lamp annealing, thereby activating the impurities implanted into the gate electrode and transforming the tungsten silicide film having a composition ratio of 3 so as to become close to a tungsten silicide film having a composition ratio of 2.

Figure 8B:
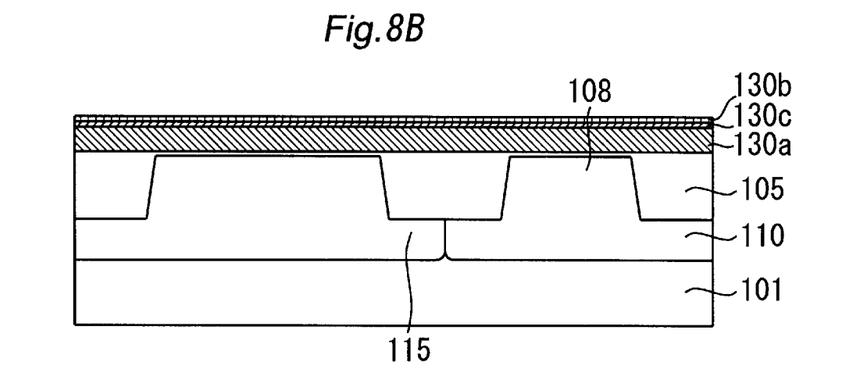
Figure 8C:
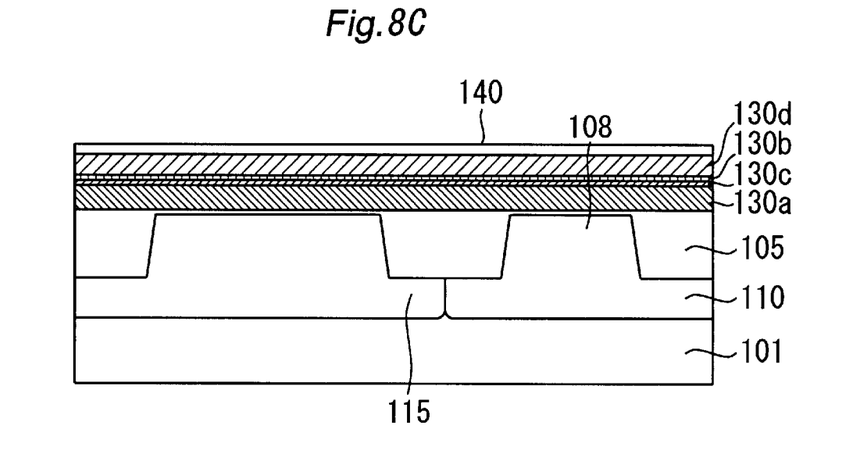

As shown in FIG. 8B, a tungsten nitride film, for example, is deposited on the barrier layer 130c as the barrier layer 130b. As shown in FIG. 8C, a tungsten film serving as the metal film 130d and an insulating film 140, which is to serve as a hard mask during an etching operation, are deposited on the barrier layer 130b. Subsequently, the silicon substrate 101 is sent to a gate etching process.

In the present embodiment, when there is formed a gate electrode structure consisting of a metal film, a barrier layer, and a polysilicon film, the barrier layer is formed into a two-layer structure consisting of a tungsten silicide film serving as a lower metal silicide film and a tungsten nitride film serving as a metal nitride film, thereby preventing diffusion of the upper metal nitride film into the polysilicon film. Thus, there can be prevented interdiffusion of a so-called dual-gate electrode. Further, a composition ratio of silicon to metal included in the metal silicide film serving as one of the barrier layers is set to a value of less than 2.4; e.g., a value of 2, and as a result interdiffusion of impurities contained in the gate electrode can be prevented. Accordingly, there can be prevented occurrence of holes in the polysilicon film, which would otherwise be induced by heat treatment to be performed in subsequent processes.

Sixth Embodiment

Figure 9A:
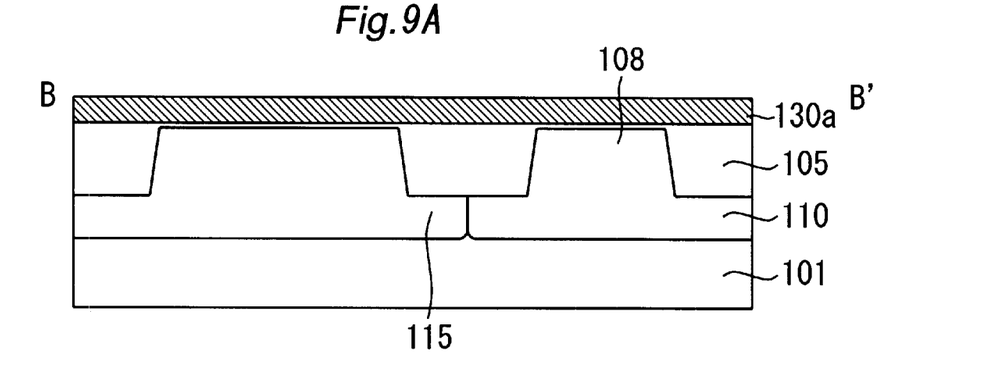
Figure 9B:
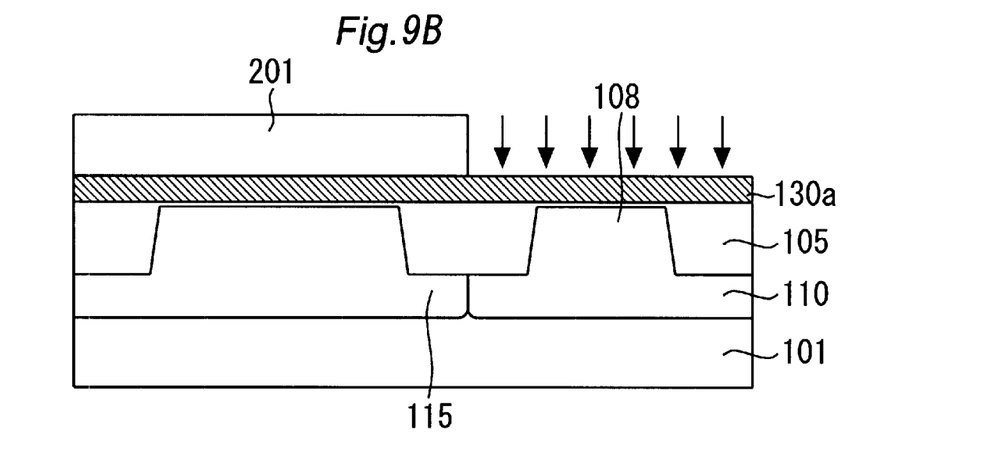
Figure 9C:
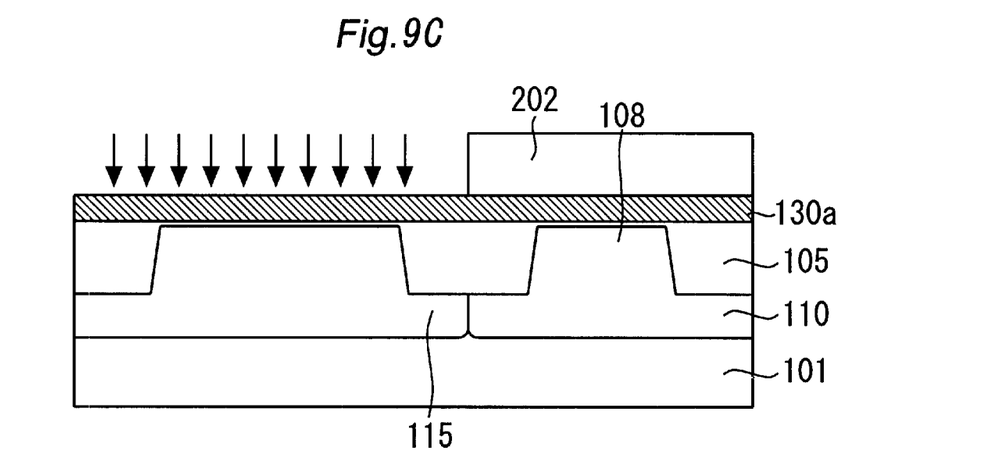

FIGS. 9A through 9C are cross-sectional views showing a semiconductor device according to a sixth embodiment of the present invention. The present embodiment substantially describes another method differing from that described in connection with the fifth embodiment. In the following descriptions, processing pertaining to steps shown in FIGS. 9A through 9C and 10A are substantially the same as processing described in connection with the fifth embodiment, and hence repeated explanations are omitted.

Figure 10A:
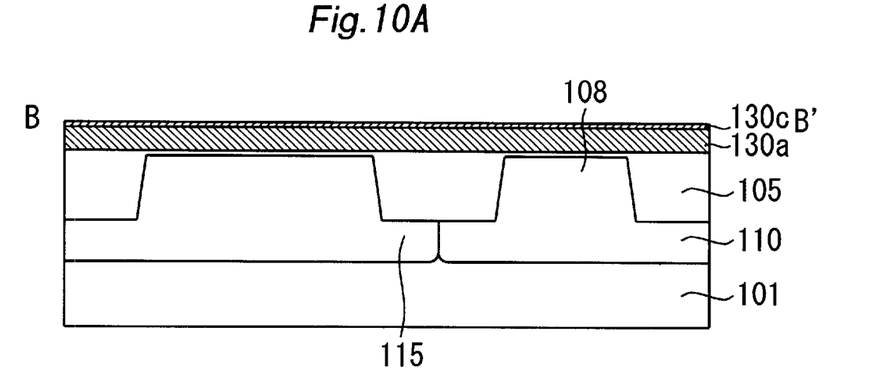
Figure 10B:
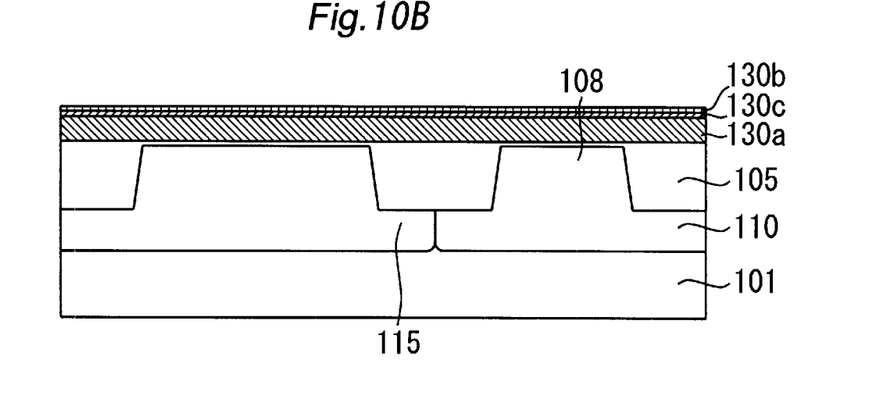

In the step shown in FIG. 10B, a tungsten silicide film constituting the lower barrier layer 130c is subjected to lamp annealing in, e.g., a nitrogen atmosphere, as a result of which the tungsten silicide film is nitrided. Thus, a tungsten nitride film, which is to constitute the metal nitride film 130b, is formed without involvement of sputtering or CVD.

Figure 10C:
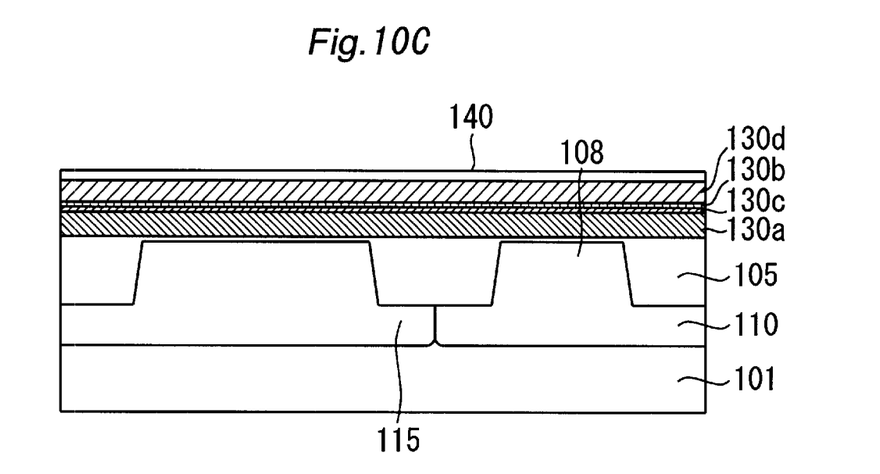

As in the case of the fifth embodiment, in the step shown in FIG. 10C a tungsten film which is to serve as the metal film 130d and the insulating film 140 which is to act as a hard mask during an etching operation are deposited. After removal of resist to be performed in the step shown in FIG. 10A, the silicon substrate 101 is to be subjected to annealing for activating impurities. However, the impurities have already been activated during the heat treatment effected in a nitrogen atmosphere in the step shown in FIG. 10B. Hence, annealing may be omitted.

Even the present embodiment yields the same advantage as that yielded in the fifth embodiment. Further, in the present embodiment, a tungsten silicide film serving as a lower barrier layer is subjected to lamp annealing in a nitrogen atmosphere, as a result of which the tungsten silicide film is nitrided. Thus, there is formed a tungsten nitride film which is to serve as a metal nitride film. As a result, the process of depositing a tungsten nitride film employed in the fifth embodiment is obviated, thereby simplifying manufacturing processes correspondingly.

Seventh Embodiment

Figure 11A:
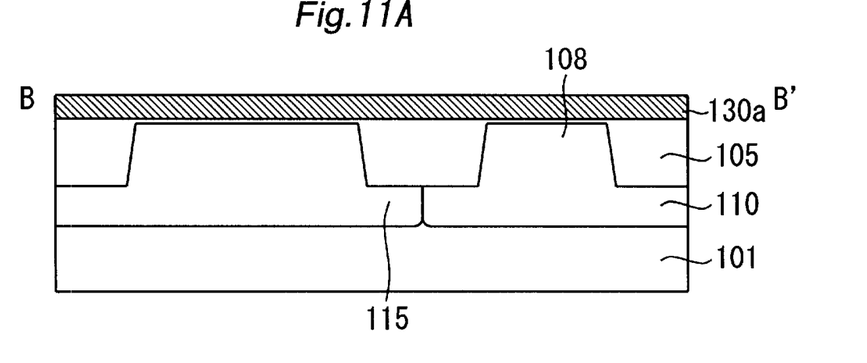
FIGS. 11A through 11C are cross-sectional views showing a semiconductor device according to a seventh embodiment.
Figure 11B:
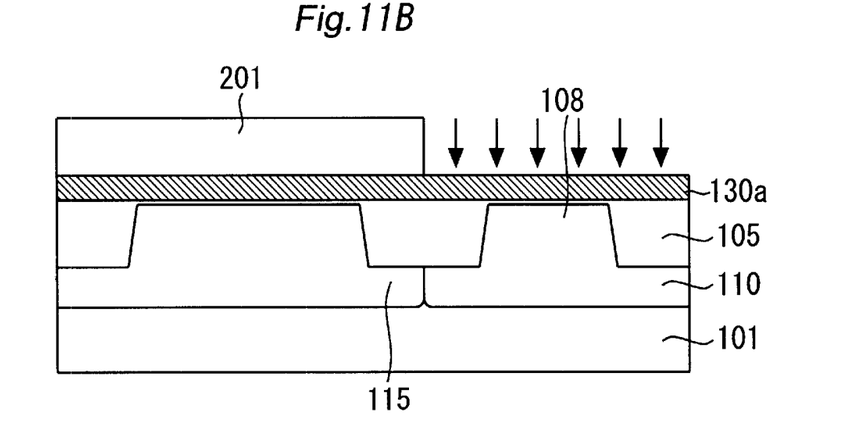
Figure 11C:
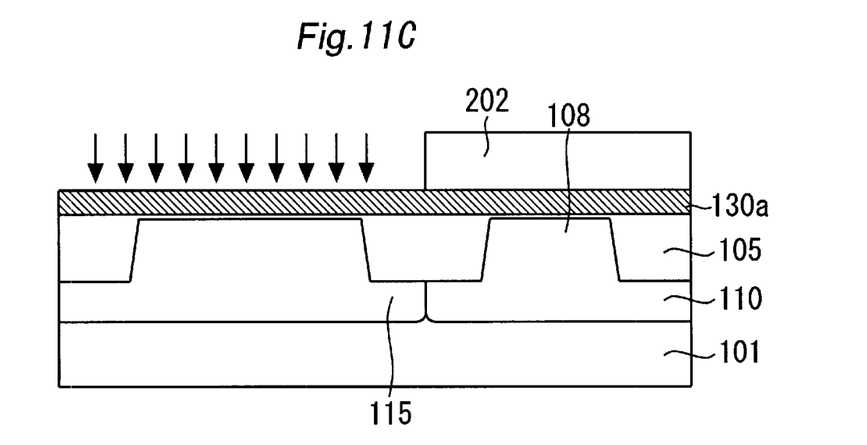

FIG. 11 is a cross-sectional view showing a semiconductor device according to a seventh embodiment of the present invention. The present embodiment substantially describes processes of manufacturing the semiconductor devices described in connection with the first embodiment. The present embodiment will now be described while elements corresponding to those shown in FIGS. 7A through 7C are assigned the same reference numerals.

FIG. 11A shows the silicon substrate 101 after the polysilicon film 130a has been deposited, as in the step shown in FIG. 7A. As shown in FIG. 11B, the portion of the polysilicon film 130a, which is to become an n-channel transistor, is doped with impurities by means of ion implantation while the resist 201 is taken as a mask. The polysilicon film 130a is subjected to ion implantation in the same manner as in the fifth embodiment. The present embodiment is characterized in that the polysilicon film 130a is subjected to additional ion implantation at the minimum. Provided that the polysilicon film 130a has a thickness of 80 nm, the polysilicon film 130a is subjected to additional ion implantation, such as implantation of arsenic at 5 keV to a dopant concentration of $5\times10^{14}/cm^2$.

As shown in FIG. 11C, the portion of the polysilicon film 130a, which is to become a p-channel transistor, is doped with impurities by means of ion implantation while the resist 202 is taken as a mask. The portion is additionally subjected to, e.g., implantation of boron at 3 keV to a dopant concentration of $5\times10^{14}/cm^2$. The silicon substrate 101 is then subjected to annealing. In the present embodiment, the silicon substrate is subjected to annealing after the portion of the polysilicon film 130a, which is to become the p-channel transistor, has been subjected to additional ion implantation. However, the polysilicon film 130a may be annealed once after primary ion implantation and subjected to annealing again while resist is again placed on the polysilicon film 130a.

In the steps shown in FIGS. 11B and 11C, ion implantation is performed twice. The first ion implantation operation is aimed at increasing the dopant concentration of the entire gate. In contrast, the additional ion implantation operation is aimed at increasing the dopant concentration of polysilicon in only the area located between polysilicon and the barrier. Since the first ion implantation operation and the additional ion implantation operation differ in target location, the ion implantation operations usually differ from each other in terms of doping conditions, such as acceleration voltage. However, if the profile of impurities is made smooth by means of subjecting the substrate to heat treatment after the first ion implantation operation and then the additional ion implantation operation is effected, there is no necessity of employing different doping conditions.

The advantage of doping impurities in the substrate several times lies in a freedom of design of an impurity profile and great process freedom.

When ion implantation is effected only once, the profile of impurities is determined by doping conditions and subsequent heat treatment conditions. In this case, if an attempt is made to intentionally increase the doping concentration of an interface, a sufficient doping concentration may fail to be obtained in a lower portion of polysilicon. In contrast, if doping conditions are set so as to compensate for the doping concentration of the lower portion of polysilicon, the doping concentration of the interface may fail to be increased. Alternatively, there may be a case where a uniform profile of impurities may be induced by heat treatment required for forming a barrier layer.

However, in a case where ion implantation is performed several times, the doping concentration of only the interface can be increased while the doping concentration of the lower portion of polysilicon is maintained. Even if a uniform profile of impurities is achieved as a result of heat treatment required for forming a barrier layer, impurities can be again doped in the interface after formation of the barrier layer.

In the present embodiment, each of the n-channel transistor and the p-channel transistor is subjected to additional ion implantation. However, it may be the case that only one of these is subjected to additional ion implantation. Subsequently, for example, a tungsten nitride film and a tungsten film are deposited. Further, a barrier layer including a tungsten silicide layer such as that described in the fifth and sixth embodiments may be applied to the present embodiment.

As mentioned above, in the present embodiment, at least either an area which is to become an n-channel transistor or an area which is to become a p-channel transistor is subjected to additional ion implantation at least once while resist is taken as a mask. Hence, contact resistance of an interface between a barrier layer and a polysilicon film; that is, interface resistance, is reduced, thereby preventing occurrence of a delay in transfer of a voltage in the polymetal gate electrode.

By application of a barrier layer including a tungsten silicide film to the semiconductor device according to the present embodiment, interdiffusion of impurities in the dual gate electrode can also be prevented.

Eighth Embodiment

Figure 12A:
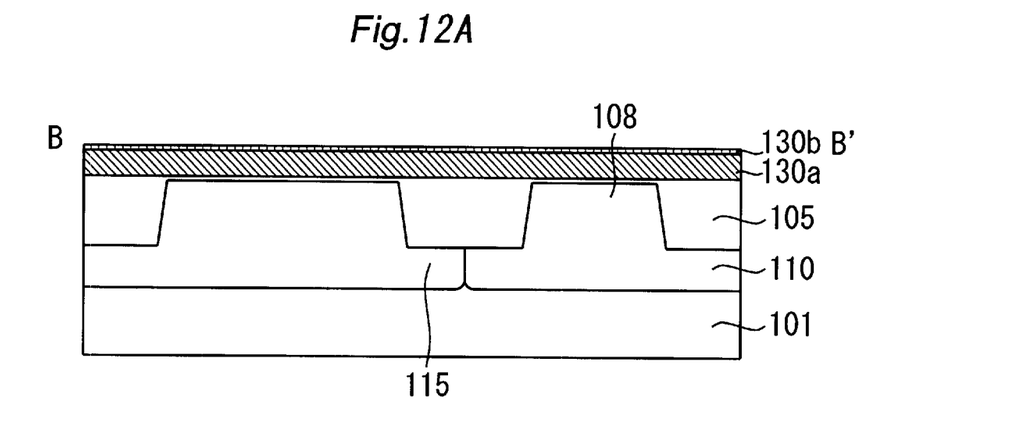
FIGS. 12A through 12C are cross-sectional views showing a semiconductor device according to an eighth embodiment.
Figure 12B:
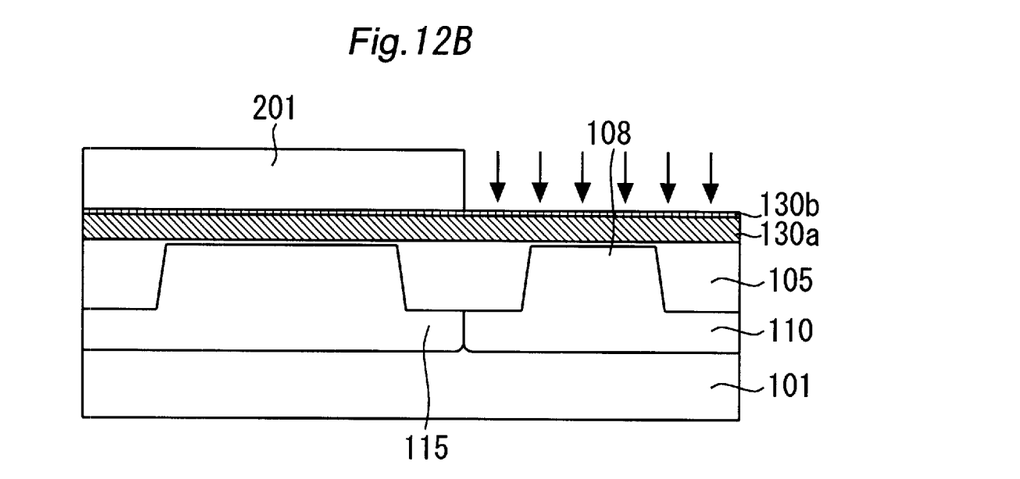
Figure 12C:
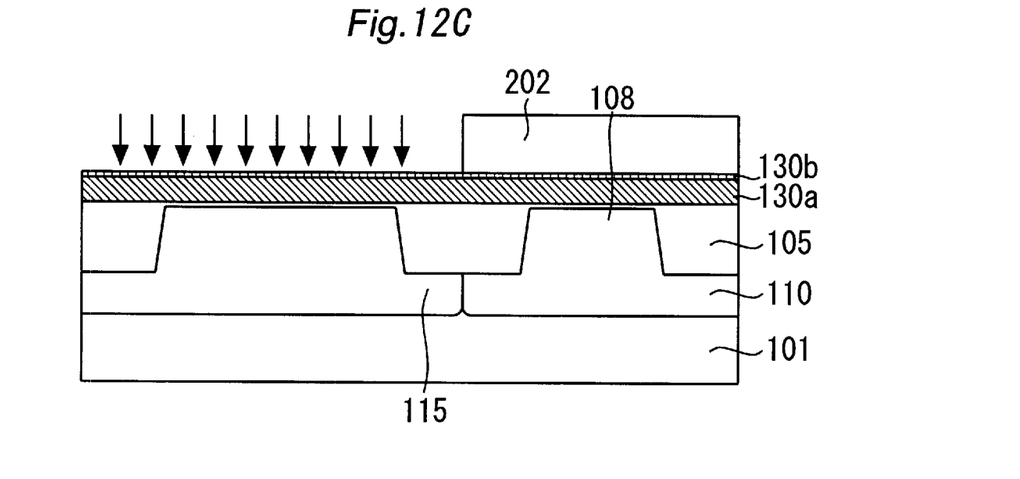

FIGS. 12A through 12C are cross-sectional views showing a semiconductor device according to an eighth embodiment of the present invention. In the present embodiment, formation of a barrier layer is followed by ion implantation. Elements corresponding to those shown in FIG. 11 are described while being assigned the same reference numerals.

As shown in FIG. 12A, production of the semiconductor substrate is carried out through the step of forming the barrier layer 130b subsequent to formation of the polysilicon film 130a. As shown in FIG. 12B, the portion of the polysilicon film 130a, which is to become an n-channel transistor, is subjected to ion implantation by way of the barrier layer 130b while the resist 201 is taken as a mask.

As shown in FIG. 12C, the portion of the polysilicon film 130, which is to become a p-channel transistor, is subjected to ion implantation by way of the barrier layer 130b while the resist 202 is taken as a mask. At this time, the barrier layer 130b is subjected to additional ion implantation; i.e., additional doping, provided that the barrier layer 130b is formed from solely a metal nitride film.

Accordingly, the present embodiment also yields the same advantage as that yielded in the seventh embodiment.

As has been described, according to the present invention, the semiconductor device is provided with a gate electrode structure including at least a metal film and a polysilicon film. The polysilicon film is doped with impurities a plurality of times such that an upper portion of the polysilicon film becomes higher in doping level than a lower portion of the same. As a result, the present invention yields an advantage of ability to prevent occurrence of a delay in transfer of a voltage in a polymetal gate electrode.

A desired profile can be readily achieved under arbitrary process conditions by means of doping impurities several times. More specifically, depletion of a gate and interdiffusion of impurities into a gate oxide film can be suppressed while the doping concentration of a lower portion of polysilicon is maintained appropriately. Further, the doping level of an interface of the barrier layer is increased, to thereby diminishing the resistance of an interface between polysilicon and metal. Hence, a high-speed device can be provided.

In the present invention, the gate electrode structure has a impurity-doped barrier layer interposed between the metal film and the polysilicon film. As a result, interface resistance between the barrier layer and the polysilicon film is reduced, thereby preventing occurrence of a delay in transfer of a voltage in the polymetal gate electrode. Further, there is yielded an advantage of formation of a gate electrode structure, which can withstand heat treatment.

In the present invention, the barrier layer is formed from a metal silicide film and a metal nitride film formed on the metal silicide film. Hence, diffusion of an upper metal nitride film into a polysilicon film can be prevented, thereby preventing interdiffusion of impurities in the dual gate electrode.

In the present invention, a composition ratio of silicon to metal included in the metal silicide film is set to a value of 2.4 or less. Hence, there are yielded an advantage of ability to prevent interdiffusion of impurities in the gate electrode and an advantage of ability to prevent occurrence of holes in the polysilicon film, which would otherwise be induced by heat treatment to be performed in subsequent processes.

In the present invention, the metal silicide film is a tungsten film, and the metal nitride film is a tungsten nitride film. Hence, there is yielded an advantage of ability to effectively prevent interdiffusion of impurities in the dual gate electrode.

The method of manufacturing a semiconductor device according to the present invention comprises a step of forming a polysilicon film on a semiconductor substrate, a step of forming on the polysilicon film a barrier layer consisting of a plurality of layers, and a step of forming metal film on the barrier layer. Hence, there is yielded an advantage of ability to prevent interdiffusion of impurities in the dual-gate electrode.

In the present invention, the step of forming a barrier layer consisting of a plurality of layers includes a step of depositing a metal silicide film on the polysilicon film and depositing a metal nitride film directly on the metal silicide film. Hence, the present invention yields an advantage of ability to contribute to prevention of interdiffusion of impurities in the dual-gate electrode.

The method of manufacturing a semiconductor device according to the present invention comprises a step of depositing a metal silicide film on the polysilicon film and a step of nitriding the metal silicide film, to thereby form a metal nitride film. Hence, manufacturing processes can be simplified advantageously.

In the present invention, nitriding of the metal silicide film is effected by means of subjecting the metal silicide film to a nitrogen atmosphere by means of lamp annealing, thus contributing to simplification of manufacturing processes.

The method of manufacturing a semiconductor device according to the present invention comprises a step of forming a polysilicon film on a semiconductor substrate, a step of doping the polysilicon film with impurities a plurality of times, and a step of forming a metal film on the impurity-doped polysilicon film. Hence, there is yielded an advantage of ability to prevent occurrence of a delay in transfer of a voltage in the polymetal gate electrode.

In the present invention, the step of doping the polysilicon film with impurities a plurality of times involves additional doping of an n-channel region with arsenic at 5 keV to a dopant concentration of $5\times10^{14}/cm^2$ and additional doping of a p-channel region with boron at 3 keV to a dopant concentration of $5\times10^{14}/cm^2$, provided that the polysilicon film has a thickness of 80 nm. There is yielded an advantage of ability to contribute to preventing occurrence of a delay in transfer of a voltage in a polymetal gate electrode.

In the present invention, at least either the n-channel region or the p-channel region is additionally doped with impurities. Hence, there is yielded an advantage of ability to provide a semiconductor device which prevents occurrence of a delay in transfer of a voltage in the polymetal gate and which has a high degree of reliability.

In the present invention, a barrier layer is formed before a step of doping the polysilicon film with impurities a plurality of times. As a result, interface resistance between the barrier layer and the polysilicon film is reduced, thereby preventing occurrence of a delay in transfer of a voltage in the polymetal gate electrode. Further, there is yielded an advantage of formation of a gate electrode structure, which can withstand heat treatment.

In the present invention, the barrier layer is formed from a metal nitride film, and hence interface resistance between the metal nitride film and a polysilicon film is reduced. There is yielded an advantage of ability to effectively prevent occurrence of a delay in transfer of a voltage in the polymetal gate electrode.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No.2001-003564, filed on Jan. 11, 2001 including specification, claims drawings and summary, on which the Convention priority of the present application is based, are incorporated herein by reference in its entirety.

What is claimed is:

1. A semiconductor device comprising:

a substrate;

a gate insulating film formed on the substrate;

a gate electrode structure formed on the gate insulating film, the gate electrode structure including at least a metal film, a polysilicon film and a barrier layer therebetween, wherein:

an upper portion of the polysilicon film is higher in doping level than a lower portion of the same; and the barrier layer does not directly contact the gate insulating film.

2. The semiconductor device according to claim 1, wherein the gate electrode structure has an impurity-doped barrier layer interposed between the metal film and the polysilicon film.

3. A semiconductor device comprising:

a substrate;

a gate insulating film formed on the substrate;

a gate electrode structure formed on the gate insulating film, the gate electrode structure including at least a metal film, a polysilicon film and a barrier layer therebetween, wherein:

an upper portion of the polysilicon film is higher in doping level than a lower portion of the same; and the barrier layer is formed from a metal silicide film and a metal nitride film formed thereon.

4. The semiconductor device according to claim 3, wherein a composition ratio of silicon to metal of the metal silicide film is set to a value of 2.4 or less.

5. The semiconductor device according to claim 3, wherein the metal silicide film is a tungsten film, and the metal nitride film is a tungsten nitride film.

* * * * *